United States Patent [19]

Aspden et al.

[11] Patent Number: 5,065,085
[45] Date of Patent: Nov. 12, 1991

[54] THERMOELECTRIC ENERGY CONVERSION

[75] Inventors: Harold Aspden, Chilworth, Isle of Man; John S. Strachan, Edinburgh, Scotland

[73] Assignee: Strachan-Aspden Limited, Edinburgh, Scotland

[21] Appl. No.: 429,608

[22] Filed: Oct. 31, 1989

[30] Foreign Application Priority Data

Nov. 18, 1988 [GB] United Kingdom ............... 8826952

[51] Int. Cl.$^5$ .............................................. H02N 3/00
[52] U.S. Cl. .................................... 322/2 R; 310/306; 322/2 A
[58] Field of Search ................ 322/2 A, 2 R; 310/306

[56] References Cited

U.S. PATENT DOCUMENTS

| | | | |
|---|---|---|---|
| 3,149,246 | 9/1964 | Mason ............................ | 322/2 R X |
| 3,199,302 | 8/1965 | Rollinger et al. ............. | 322/2 R X |
| 3,365,653 | 1/1968 | Gabor et al. ................... | 322/2 R |
| 4,004,210 | 1/1977 | Yater ............................. | 322/2 R |
| 4,368,416 | 1/1983 | James ............................ | 322/2 R |
| 4,419,617 | 12/1983 | Reitz ............................. | 322/2 R |

Primary Examiner—R. J. Hickey
Attorney, Agent, or Firm—Ratner & Prestia

[57] ABSTRACT

A thermoelectric energy converter incorporates thermocouples in a circuit carrying A. C. current via capacitors which provide electrical coupling but obstruct heat transfer between hot and cold junctions. The cyclic current oscillations through the capacitors are diverted by special circuits so as to be rendered asymmetric as current oscillations through the thermoelectric junctions. One such circuit includes the use of a diode configuration regulating current flow through different thermoelectric junctions spaced apart in the thermal gradient. Another involves the action of a unidirectional magnetic field having a polarizing effect on a three-metal thermoelectric junction.

15 Claims, 1 Drawing Sheet

THERMOELECTRIC ENERGY CONVERSION

FIELD OF INVENTION

This invention relates to energy conversion by thermoelectric techniques. In particular, it relates to a novel method by which a temperature differential can either be established by supplying electrical power or utilized to generate such electrical power.

Conventional thermoelectric energy conversion devices use the Peltier effect or the converse, the Seebeck effect. Hot and cold junctions connect dissimilar metals in a closed circuit and the EMF develops current in the circuit in a measure related to the temperature differential and rate of heat input or output. However, such devices find little application as energy sources, owing to their poor conversion efficiency. This arises because the design criteria for minimizing ohmic resistance loss, e.g. by having the junctions in close proximity, maximize the heat loss by heat conduction. For this reason the use of inexpensive metallic materials as conductors in thermopiles is not generally deemed practical.

To achieve tolerable efficiencies, as in refrigeration systems, research has tended to concentrate upon the use of semi-conductor techniques or scarce substances which are expensive. Evenso, the power conversion efficiencies of known thermocouple devices cannot compare with the efficiency of the heat to electricity conversion of conventional electrical power generation using heat engines.

This invention overcomes the above deficiency in thermoelectric circuit design. It implements a novel principle in a special way with the remarkable result that very high efficiencies of power conversion from heat to electricity or vice versa can be achieved without using expensive materials. Given a high efficiency of energy conversion the design problem then centers on assuring a high enough rate of energy throughput to warrant commercial application.

It is foreseen that apparatus implementing this invention can ultimately replace the heat engines used as the prime movers in electric power generation. However, inasmuch as the apparatus can operate efficiently with low temperature differentials measured in tens of degrees rather than hundreds, an intermediate application will be that of generating electricity from what has hitherto been regarded as waste heat in conventional systems.

In the reverse mode, where electricity is used to set up temperature differentials, the invention provides cooling apparatus of such efficiency that wholly new kinds of technological design become feasible.

In summary, this invention relates to a new kind of thermoelectric circuit based on the Peltier and Seebeck effects. It departs from what is conventional by applying a novel principle which obstructs heat flow between hot and cold thermocouple junctions, whilst admitting the passage of electric current through the junctions in a way which involves a net energy conversion.

BACKGROUND OF THE INVENTION

The basic principle of the invention to be described is believed by the inventors to be wholly original in the sense that what has been achieved uses an A.C. excitation technique which interposes capacitors in a thermocouple circuit. The operation is in A.C. mode, even though the electrical power supplied to or by the system can be D.C. or A.C. The inventors have no knowledge of any prior disclosure which is based on the conception that a thermocouple device can operate by current passage through the junctions in a sustained A.C. mode. Indeed, the normal expectation of such a proposal would be that the cyclic heating and cooling of each thermocouple junction at the operating frequency should have no advantage for energy transfer and should merely generate ohmic loss and lose heat by thermal conduction.

Concerning the effects of a magnetic field on thermocouple operation, a subject which arises in describing certain aspects of the invention, the inventors are aware of experiments where the effects of magnetic fields are used to measure the Nernst effect, for example. In these experiments thermocouples are used to measure temperature differentials in the presence of strong magnetic fields. However, none of the scientific papers seen by the inventors discusses any anomalous effects of the magnetic field upon thermocouple operation. Bearing in mind that instrumentation techniques based on galvanometer measurement using direct current often rely on a minimal current flow by using balancing potentials, it is conceivable that certain effects occurring when alternating or significantly high current densities flow through thermocouple junctions subjected to magnetic fields have not hitherto been researched. In these circumstances, though the primary invention in its broadest concept is not concerned with the interaction with magnetic fields, the scope of certain aspects of the invention to be disclosed extends in this direction.

BRIEF DESCRIPTION OF THE INVENTION

The invention centers around providing a means for restricting the conduction of heat between junctions in a thermocouple circuit, while allowing the relatively free flow of electrical energy.

The invention is based on the principle of a thermoelectric circuit in which electric current flows between the hot and cold junctions by the capacitative induction processes acting across a dielectric between the plates of a capacitor. Heat flow is obstructed by the heat insulation properties of the dielectric insulation.

In implementing this invention it is essential that the circuit design is such that the thermoelectric junctions function asymmetrically in the heat transfer relationship with respect to the direction of current flow.

The preferred implementation of the basic principle underlying the invention involves several inventive features, which have found their endorsement by experiment rather than being based on the logic of established theoretical expectations. These features, in combination, can be demonstrably shown to provide highly efficient operation as a practical thermoelectric power converter, based on an oscillatory current in the thermocouple junctions.

In accordance with one aspect, a thermoelectric energy converter comprises:

a thermoelectric circuit assembly having two parts a thermally non-conductive barrier mounted between said parts being respectively connected to terminals adapted to be coupled to an external electric power system, a structure for housing the thermoelectric assembly, said housing being bounded by heat transfer elements providing two external thermal interface surfaces and two internal thermal interface surfaces, there being layers of heat-conducting electrically non-conducting insulation separating the heat transfer elements from the thermoelectric circuit assembly, a first pair of thermocouple junctions included in said assembly, said junctions being formed by contact between metals having different thermoelectric properties and connected by these metals as part of a closed loop circuit, the thermocouple junctions being respectively in said parts of the assembly, a second pair of thermocouple junctions included in said assembly, formed by contact between metals having different thermoelectric properties and connected by these metals as part of a closed loop circuit, the thermocouple junctions being respectively in said parts of the assembly, a pair of capacitors having dielectric insulation, both capacitors being included in each of the closed loop circuits and both capacitors having their electrodes respectively connected in said two parts of the circuit assembly, whereby the capacitor dielectric insulation provides the thermally non-conductive barrier and whereby connection of the capacitors in both closed loop circuits provides alternative flow paths for capacitor current through different pairs of thermocouple junctions, circuit polarization means selectively responsive to the capacitor current flow direction positioned so as to divert at least some of the current through one pair of thermocouple junctions for current flow in one direction and through the other pair of thermocouple junctions for current flow in the opposite direction, and circuit interrupter means connected between the circuit assembly and the terminals for varying the load impedance effective in the loop circuits at a rapid rate to set up current oscillations through the capacitors when thermoelectrically powered currents flow around the thermocouple loop circuits that are commensurately related to a temperature differential set up between the two heat transfer elements.

For an integral capacitor-thermocouple fabrication, the incorporation of capacitor impedance in the thermocouple circuit implies that the utility of the converter in power applications may depend upon there being a high operating frequency, which in certain embodiments of the invention will be several hundred kilohertz. Optimum performance criteria include the use of resonant circuits based on the provision of inductors in the general circuitry of the system. Also the circuitry can include electronic components which operate according to conventional circuit principles to cause the circuit to self-activate the oscillatory condition. Alternatively, the means for activating an oscillatory circuit current flow comprises an external source of A.C. power, characterized in that the frequency of this source is the same as the resonant frequency of the thermoelectric circuit.

A thermoelectric energy converter based on this invention can be used in air conditioning, heating or refrigeration apparatus, besides constituting elements for primary generation of electric power using low grade heat sources or heat sources of moderate temperature differential.

Other features of the invention will be evident from the following description by reference to the drawings. Also, as will be seen from this description, the optimum performance of devices incorporating this invention is very much dependent upon the tuning of the resonant circuitry involved. A high Q factor is necessary to secure high efficiency but its actual value in relation to the damping factor of the source circuit is important so as to avoid instability, particularly for devices operating in the Peltier mode.

DETAILED DESCRIPTION OF THE INVENTION

The principles of the invention will now be described by reference to two different thermocouple devices, both of which exhibit efficient energy conversion under test.

One device involves a single junction pair coupled to separate capacitor components which do not form an integral part of the thermocouple structure. This is designed to function at a relatively low activation power frequency commensurate with the larger capacitances involved.

The second device, which will be discussed first, will be described by reference to FIG. 1 as if it utilizes separate capacitor components of unspecified design, but a practical implementation requires the capacitors to obstruct heat transfer across the plates of the capacitor. To operate in this way the capacitors must be positioned with their respective plates heat coupled to the heat exchange surfaces serving as the heat output/input interfaces of the system. Thus a normal practical embodiment will be one in which the capacitor is fabricated as part of an electric circuit integral with the thermocouples and other electrical components. Such an embodiment can be fabricated using the techniques and materials which are familiar to those skilled in the art of semiconductor integrated circuit design.

Figure 1:
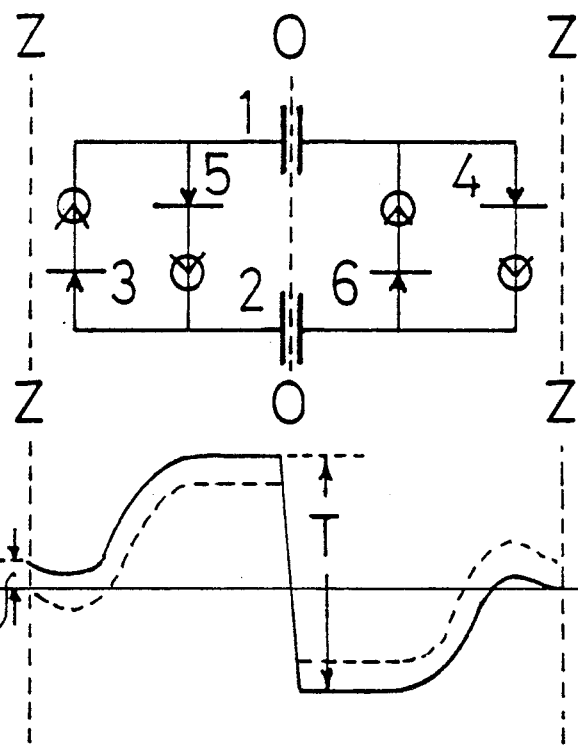
FIG. 1 shows schematically a general circuit which operates according to the principles of the invention but according to an aspect of the invention which does not involve magnetizing means for assuring asymmetric operation.

FIG. 1 shows one closed thermoelectric circuit comprising two capacitors 1, 2 which isolate the 'hot' and 'cold' sides of the device, separating them in a thermal sense, whereas the capacitors couple them together electrically. Here 'hot' and 'cold' are used in a purely relative sense to relate to what can be a quite small temperature difference $\delta T$ between the two heat output/input interfaces. It may be supposed that the hot side is to the left of the capacitors and the cold side to the right in FIG. 1. The circuit includes four thermocouple junctions and four diodes. Their physical position in relation to the heat output/input interfaces or primary heat exchange surfaces, denoted by the broken lines Z—Z, is generally as shown in the figure. Thus two diodes 3, 4, one on the hot side and one on the cold side of the capacitors, conduct the capacitor current during one polarity half cycle of oscillation and two diodes 5, 6, one on the hot side and one on the cold side of the capacitors, conduct the current during the other polarity half cycle.

Each diode is connected in series with a closely adjacent thermocouple junction. The latter are depicted by circles with arrows corresponding to the direction of the current flow allowed by their respective diodes. In FIG. 1, each diode is positioned behind the corresponding thermocouple, meaning that current flows first through the diode in each case. Equally, all the diodes could be positioned in advance of the corresponding diodes to achieve the same functional effect. It can be seen that the arrangement is such that during one half cycle of circuital capacitor current the flow is through the outermost diode/thermocouple junctions, that is those closest to the surfaces Z—Z, and during the opposite half cycle the flow is through the innermost diode/thermocouple junctions.

The bimetallic junctions and conductors electrically coupling these junctions to the capacitors and diodes may comprise, for example, copper and lead. The configuration must be such that the current flow in either circuit is from copper to lead in the junction on one side of the capacitor thermal barrier O—O and from lead to copper on the other side.

Thus, in operation, assuming that there is an oscillatory current in the circuit through the capacitors, we can suppose that the thermocouple junction paired with diode 3 will cool in carrying its unidirectional current half cycles, whereas the thermocouple junction paired with diode 4 will heat. Conversely, the current half cycle in the opposite direction will cause a heating of the thermocouple junction paired with diode 5 and a cooling of the junction paired with diode 6.

Figure 2:
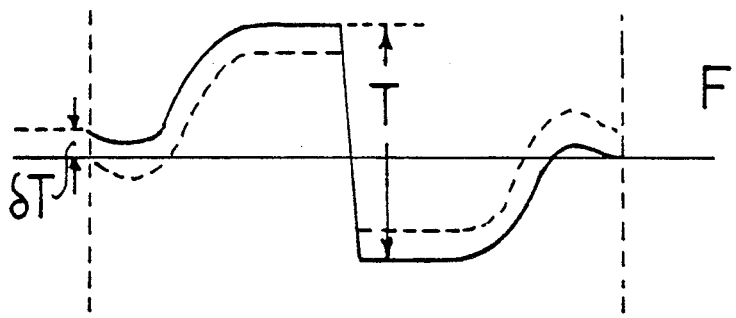
FIG. 2 is a temperature gradient diagram relating to the operation of the circuit shown in FIG. 1.

It follows that the presence of the current oscillations will act to transfer heat energy thermoelectrically to set up a temperature profile depicted schematically by the full curve in FIG. 2. Note that since heat energy cannot easily traverse the heat barrier O—O provided by the capacitor dielectric insulation, the operation of the thermoelectric junctions is to set up a substantial temperature differential as between the innermost thermocouples regulating one polarity of current flow. In contrast, owing to the limiting effect of the temperatures of the heat exchange surfaces Z—Z, the thermoelectric junctions nearest to those surfaces and regulating the other polarity of current flow have a very much smaller temperature differential.

The oscillations will not normally be of truly sinusoidal waveform, nor will the successive polarity reversals be strictly half-cycle in time measure. The basic condition is that as much electric charge must flow one way as flows the opposite way in the next polarity reversal period. However, because there is a significant difference in the temperature differentials determining the thermoelectric power of the respective current directions, the electrical oscillations are powered in EMF terms in such a way that they can feed energy or absorb energy from a suitably connected load. Assuming that very little heat energy is dissipated by conduction through the capacitor dielectric, and that ohmic losses on the cold side of the system are small, the electrical input/output energy can only translate into heat output/input energy via the temperature differential $\delta T$ across the heat exchange surfaces Z—Z.

It will be seen that the circuit configuration described does, therefore, provide the asymmetry feature already mentioned. By fabricating a very compact circuit which maximizes the conductor sectional area of the thermocouple junctions the ohmic losses can be very small. Although this means a high rate of heat transfer between thermocouple junctions on the same side of the heat barrier O—O this does not waste heat energy. Its effect is to limit the build up of the temperature differential denoted T in FIG. 2. However, in spite of this there can be a very substantial overall efficiency in the thermoelectric energy conversion as between electrical power and the thermal power associated with $\delta T$.

If the device operates to use heat input to generate an electric power output, the temperature profile is as shown by the full curve in FIG. 2. However, in the converse mode the broken curve represents the temperature profile where electric power input develops the temperature differential. The hot and cold sides of the converter are then interchanged.

In the operation of this device, whether working in Seebeck or Peltier modes, it is found that a D.C. voltage develops across the capacitors. The general profile of this voltage across the section of the device resembles in some respects the temperature profile presented in FIG. 2. This condition presumably arises from the Thomson effect by which a temperature gradient can set up a corresponding potential gradient in a conductor.

Experiments with operation in the Seebeck mode have shown that a thermal travelling wave is set up which flows from the hot to cold sides of the assembly. The energy carried by this wave has the effect of augmenting the current in the electrical circuit, which is tuned for resonance by an inductor in the external circuit. By placing a non-inductive load resistor across such an inductor, tests reveal that its damping factor is inversely proportional to the temperature gradient. This current augmenting effect is analogous to the behaviour of a 'current dumping amplifier', the essential difference being that the energy is supplied thermally instead of electrically.

Figure 4:
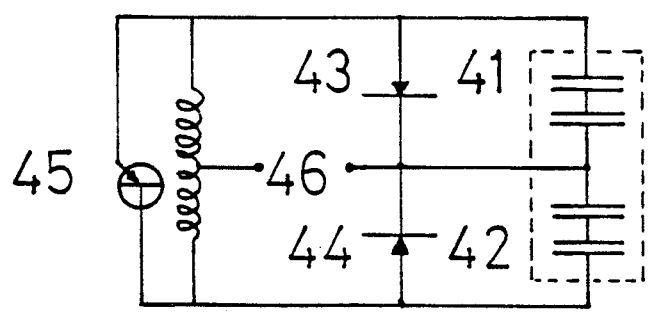
FIG. 4 shows diagrammatically a typical circuit arrangement suited to the excitation of the electrical resonance in the operation of thermoelectric converters incorporating the invention.

The device has also been shown to be capable of functioning in the Peltier mode, but the operation in this case was critically dependent upon the frequency tuning. The frequency has to be tuned to the overshoot and hysteresis of the diodes and the thermocouple junctions. For this reason the tuning of the overall system must be very carefully set up at a Q factor just greater than the damping factor of the source impedance. The source impedance is here determined by the overshoot 'on' time of the silicon controlled rectifier in circuit or the equivalent programmable unijunction, as a function of the quarter-cycle of the resonant frequency. The general form of the external tuning circuit will be described below by reference to FIG. 4.

The efficiency of the system just described by reference to FIGS. 1 and 2 tends to the Carnot limit, since the speed and frequency of the wave are automatically determined by the work/heat exchange of the junctions on either side of the capacitors at resonance with the circuit. Like all Carnot systems, the rate at which energy is exchanged is determined by the speed of the energy exchange at any part of the system. Accordingly, the system is limited in rate by the overshoot of the diodes and by the thermal conductivity of the combined junctions metals. If the frequency of the system is too high, the greater Thomson effect in the lead conductor with respect to copper will cause the damping factor to rise over a period of time and stall the system after a few thousand cycles. The maximum performance rate occurs when the damping factor determined by the Thomson effect and the load are as close as possible and together are less than the Q factor of the total circuit. Owing to the several factors involved in setting up these conditions, adjustments in the related design parameters of this particular embodiment of the invention have so far been established by trial and error methods.

For the reasons outlined above, the system shown in FIG. 1 is best suited to applications where efficiency of energy conversion is more important than the energy throughput rate, so that the Q factor need not be so high as to render the system liable to instability under operating conditions.

It is stressed that this invention does provide systems which operate to convert heat and electrical energy in a highly efficient way. In choosing between the different methods and embodiments which implement different aspects of the invention, the primary criterion, depending upon the application, would normally be the energy throughput rate. Much depends upon the ongoing research to find the best design and the best combination of materials. Furthermore, though there are some indications that the new techniques provided by this invention do yield signal performance enhancement beyond that of conventional thermocouple technology, the entire conversion efficiency gain, which is very high and is its primary advantage, may nevertheless be due exclusively to the way in which the capacitors minimize heat dissipation.

Concerning the capacitor fabrication, the relative permittivity of most dielectrics is inversely proportional to the thermal conductivity, with the odd exception, so that in general high dielectric strength materials are better suited to this application since they improve the ratio of electric power to rate of thermal loss.

There is an aspect of the system shown in FIG. 1 that warrants special comment. Usually, with thermoelectric circuits, the only potential barriers are those occurring at the junctions of two metals. In FIG. 1 the diodes themselves introduce other junctions. There is purpose, therefore, in supposing that, for the purpose of setting up thermoelectric potentials, there are two basic metals involved which have charge carrier densities denoted p and n. The diodes have an internal property that involves conductive substances comprising charge carrier population densities p' and n'. The diode operation depends upon the fact that current flow bringing p' and n' charges together is permitted current flow and action tending to separate p' and n' is restrained by an EMF which blocks current flow. However, the p and n carrier densities in the basic metals are conducive to current flow in either direction.

It may then be seen that there is another asymmetry in the circuit shown in FIG. 1 because, when current flows clockwise, supposing p applies to the base metal on the lower part, the carrier sequence is p-p'-n'-p-n on the left hand side and n-p'-n'-n-p on the right hand side. In terms of the thermoelectric contact potentials, the n-type interface with a p-type tends to give the same potential difference as a function of temperature, regardless of carrier density. However, there is no such equality for the p'-p and n'-n junctions, where the potential is a function of temperature and the logarithm of the charge carrier density ratio.

What this means is that the effective Peltier coefficients of the two parts of the circuit on the different sides of the capacitors need not be identical, even at the same temperature. This results in an asymmetry which is exploited to cause continuous energy transfer via the electrical route without significant heat transfer across the capacitors. Note, therefore, the importance of positioning the diodes on either side of the capacitors so that they are all in advance of the the thermoelectric junctions in the sense of current flow, as shown in FIG. 1, or, alternatively, are all in the retarded position, as they would be if all the diodes were reversed in FIG. 1.

The action described by reference to FIG. 2 must be seen as a transient condition if based exclusively on conventional thermodynamic theory, which condition, however, is sustained by extending the theory in the way just described, owing to the special asymmetry provided by the diode characteristics.

Thus, in understanding the basic mode of operation of the system in terms of Carnot effects it is best to regard the thermocouples as all at the same initial temperature. Then, if working in Seebeck mode, application of heat on one side of the capacitors sets up the transients leading to electrical power output in the manner discussed. However, the sustained operation within the limits set by the Carnot thresholds depends upon the asymmetry features incorporated in the system and such asymmetry is essential.

The next embodiment of the invention aims to avoid the dual thermocouple-diode configuration and the need for semi-conductors in the internal system of the thermoelectric assembly. Instead, the asymmetry of conventional operation is introduced in a basic thermoelectric circuit by using a magnetic field action.

However, there is an asymmetry associated with the non-conventional thermodynamic aspect as well. This arises because three metals are used and, by the argument just presented, if one involves p-type carriers and the other two involve n-type carriers, the closed circuit series loop formed by the three metals must have two opposing-potential p-n junctions and one junction that has a thermoelectric contact potential determined by the logarithm of the ratio of the two n-type densities. Of necessity this will set up a circulating bias current where the three metals are united and then any passage of other current through the junctions will tend to be subject to a bias effect regulated by the direction of current flow. Note that n-type and p-type, as applied to base metals, does not refer to doping in the sense understood from semiconductor theory. Rather it refers to the polarity, negative or positive, of the charge carriers, as evidenced by the sign of the Hall effect or, in some cases, the Thomson effect applicable to the metal.

The essential principle on which the invention is based is that if the dielectric of a capacitance separates the relatively hot and cold parts of the thermocouple system, there can be no significant heat energy transported by the electric current. The electric charge is arrested at the capacitor plates. There can, with appropriate design, be a nearly uniform temperature in the parts of the circuit on the hot and cold sides of the capacitor, which then precludes appreciable action based on the Thomson Effect and leaves the thermoelectric power of the couple as the primary EMF.

This requires operation in an A.C. mode and this can allow another principle to operate. This is that, if the energy exchange between heat and electric power at a junction depends preferentially upon the direction of current flow as a function of frequency and current density, then the optimization of these parameters can yield a greater rate of energy exchange. Given that there is a contact potential difference across a metallic interface, flow of current in the same direction as the potential drop will cause cooling and flow in the opposite direction will cause heating. If the physical action involved can be caused to be biased to ensure this operation is asymmetrical then there will be a residual heating or cooling related to overall passage of A.C. current. Especially as the capacitances involved can be very small, a high frequency operation, perhaps measured in hundreds of kilocycles, can allow substantial current flow. The latter assures the higher energy throughput rate.

The action described is reversible, in the sense that if electric current flow produces a heating effect at a junction, a cold regulating heat sink associated with the junction will encourage current to flow and so develop an EMF at that junction. Thus the principles apply for systems converting electricity into heat energy transfer between cold and hot interfaces or systems operating to generate such electricity from heat transfer between those surfaces. The enormous advantages provided by the invention arise essentially from the saving of heat energy otherwise lost by conduction through metal conductors connecting the thermocouple junctions.

However, it is necessary to assure the asymmetrical response of the thermocouple junction. One method used in the embodiment of the invention now to be described involves the use of a composite junction in which there are two metals A, B and an intermediate metal C, configured according to their different thermoelectric properties and conductivities and subject to a magnetic field.

The effect of a magnetic field is that it may have a migratory effect on electron flow at interface boundaries, the direction of migration being independent of the direction of the main current flow, but it may also have an effect on collision probabilities by modifying the electron mean free path.

However, a particular implementation of the invention operates more by what can be termed 'polarized inductive response'. The principle is to cause a current to flow along a section of conductor C which is common to two separate closed circuit paths through conductors A and B. The current in C will divide at a junction between the parallel routes through A and B, which are also in interface contact in the junction assembly. The circuits lie in a common plane, so that, in flowing around the A-C circuit, the current flows around, say, a clockwise circuit when the current in the B-C circuit circulates anti-clockwise, and vice versa during the alternate half-cycles of the alternating current.

Given now that there is a unidirectional ferromagnetic field linking both the A-C and B-C circuits in the same direction transverse to the plane of the circuits, the mutual inductive coupling between that field source and the circuits can have an asymmetric inductive effect in the two circuits. In effect, magnetic energy stored in circuit A-C during one half cycle of A.C. will involve a greater back EMF than energy stored in circuit B-C during the same half cycle. This will favor current flow in circuit B-C. Then, during the next half cycle current flow is favoured in circuit A-C.

The effect of this is to cause an asymmetrical response to the opposite polarity current cycles, even though the circuit paths through metal A and B are designed to have the same resistance.

Figure 3:
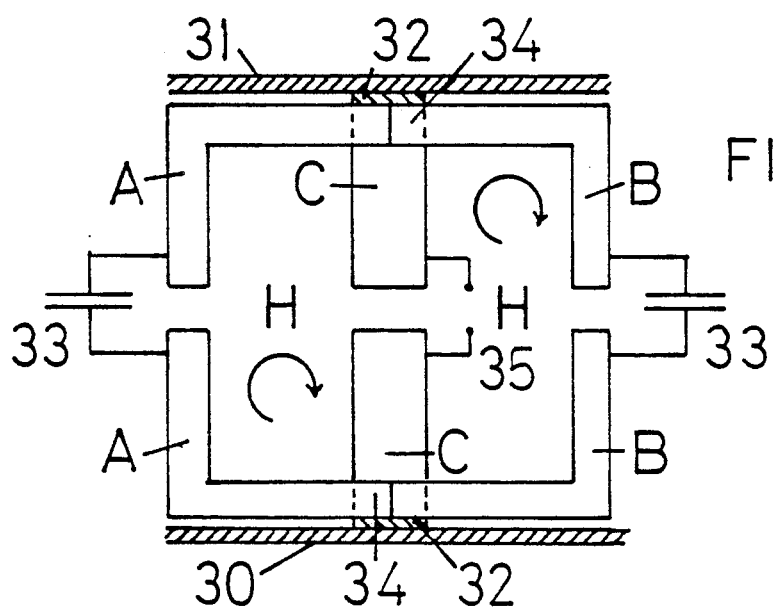
FIG. 3 shows a sectional view of a thermoelectric apparatus incorporating the invention by using an electric A.C. input at conventional power frequency to set up a cooling action on one face of the panel and a heating action on the other face.

In FIG. 3 a thermoelectric energy conversion device based on these principles is shown which does not necessarily require fabrication of capacitors as part of the thermocouple circuit. It is essentially a low voltage device producing high current throughput and using much larger metal junctions. It operates at power or low kilocycle frequencies.

To secure the same advantage of heat insulation in the electric circuit, capacitors are used. However, these can be self-standing capacitors with much larger capacitance than might be fabricated using a single dielectric layer integrated circuit technique. Though techniques for generating electrical oscillations are possible, as by using variable magnetic reluctance systems, this description will relate to a device operating in the Peltier mode. An A.C. electrical current is supplied and used to regulate heat exchange.

Referring to FIG. 3, a thermoelectric energy conversion system comprises two heat exchange surfaces 30 and 31 which are electrically insulated from the thermocouple elements by layers 32 of heat sink compound. The circuit configuration includes two capacitors 33, which serve as A.C. electrical couplings in the circuit but block heat conduction by electron flow. The thermocouple junctions are composite configurations 34 of metal assemblies of copper, nickel and zinc, denoted A, B and C, respectively. The arrangement is such that electric current around the circuit can flow either through the copper-nickel A-B junction or between copper or nickel via their interface A-C, B-C junctions with zinc. Note, however, that a strong magnetic field denoted by the circular arrows and symbol H acts on the circuits thus formed. The circuits lie in a common plane and the field H is perpendicular to that plane. This field H is unidirectional and is produced by a permanent magnet field whose source is not shown.

As already explained, the current flow in circuits A-C and B-C is asymmetrical with regard to polarity reversals of A.C. flowing through the capacitors. The balancing current flow needed to keep the current oscillations via the capacitors in polarity balance is that in the A-B circuit. Thus the current flow through the junction interfaces has an asymmetrical feature.

The A.C. excitation of the circuit can be via the terminals at 35, which may be supplied by an external A.C. source, which may itself include a capacitor for further heat insulation purposes.

In operation a supply of A.C. power is found to develop a temperature differential between surfaces 30 and 31. The conversion of electrical power into an action transferring heat between the two surfaces is very efficient. Experimental work verifying the operation of this technique shows that the A.C. operation is effective at normal power frequencies. The maximum frequency that has been achieved to data with this system is only a few kilohertz, which means that the capacitors must have a large capacitance.

In one arrangement in which the nickel conductor was replaced by lead the need to balance the circuit resistance in the two parallel paths through A and B presented problems owing to the dimensions and fragility of the lead part of the circuit. By using a ferromagnetic material for a conductor such as A. specifically nickel, it was found possible to have an operative system by confining the region of action of the magnetic field H to the interface regions of the junctions. It seems that Lenz's law then operates to take care of the differential impedance as between the two paths through A-C and B-C and a moderately acceptable A.C. performance is obtained.

A possible effect of the magnetic field H, which accounts for the phenomenon effective in this latter embodiment of the invention, is to produce a helical motion of conduction electrons as they react to the field in conforming with the Lorentz force law. This motion is about axes parallel to the field H and so, at the contact surfaces forming the thermocouple junctions, the field has negligible effect on electron motion across the junctions interfacing with zinc. On the other hand it affects conduction electron migration across the copper-nickel A-B interface.

In a sense, the Lorentz force also gives rise to a Hall effect and this plus the thermoelectric features of the three metal combination can be factors militating in favour of any asymmetry. The effect of all this is that flow of current in one direction favours a circuit through the zinc, whereas that in the other direction it favours the direct circuit across the copper-nickel interface. This applies when the field H is present, and, for balanced operation, a similar magnetic field should be provided in the other composite thermocouple junction configuration 34.

A practical circuit incorporating the system described by reference to FIGS. 1 or 3 would normally include an inductor tuned to resonate with the capacitor at the operating frequency.

The circuit design could incorporate inductive elements in series with the capacitors or in parallel, but in the interests of minimizing ohmic losses there are advantages in providing the inductance external to the thermally active components of the converter. Thus in FIG. 4 a configuration is shown in which an inductor 40 is connected to two capacitative units 41, 42 and two diodes 43, 44 in a bridge configuration. The arrangement is such that, with the capacitances of units 41 and 42 matched, there will be resonant oscillations at a frequency governed by the inductor-capacitor combination.

Presuming that one or both of the capacitative units 41, 42 comprise a multiplicity of component circuits formed by a series connection of thermoelectric circuits of the form shown in FIG. 1, it is seen that the inductor 40 can operate to sustain current oscillations through the capacitor system.

Assuming that the thermoelectric energy conversion involved in this system is using input heat energy to develop an electrical output it is desirable to provide an SCR (silicon controlled rectifier) 45 which operates as a trigger in limiting and controlling the oscillations. If a D.C. output is required this can be drawn from the terminals 46 between a centre tap on inductor 40 and the bridge linking the diodes 43, 44 to the capacitor units 41, 42. Conversely, if the system operates in the reverse mode, D.C. energy supplied to these terminals 46 can develop a temperature differential across the heat exchange interfaces of the thermoelectric converter in this system.

Research has shown that devices incorporating the general principles so far described can be used in one mode at room temperature and powered by a piece of ice melting and generating enough power to drive an electric motor and, in the reverse mode also at room temperature, to cause a input of electric power from a small battery to freeze water at a rapid rate. Such a device is self-activated to sustain its internal oscillations at several hundred kilocycles without any external additional energy or signal input. The efficiency of conversion of heat energy to or from electrical energy is extremely high, being in the region of 80 to 90 per cent. This is clearly demonstrated in such a simple demonstration by the fact that, with the motor load disconnected, the ice melts at between one seventh and one tenth of the rate applicable with the load connected.

We claim:

1. A thermoelectric energy converter comprises:
    a thermoelectric circuit assembly having two parts respectively connected to terminals adapted to be coupled to an external power system;
    a thermally non-conductive barrier mounted between said parts;
    a structure for housing the thermoelectric assembly, said housing being bounded by heat transfer elements providing two external thermal interface surfaces and two internal thermal interface surfaces, there being layers of heat-conducting electrically non-conducting insulation separating the heat transfer elements from the thermoelectric circuit assembly,
    a first pair of thermocouple junctions included in said assembly, said junctions being formed by contact between metals having different thermoelectric properties and connected by these metals as part of a closed loop circuit, the thermocouple junctions being respectively in said parts of the assembly,
    a second pair of thermocouple junctions included in said assembly, formed by contact between metals having different thermoelectric properties and connected by these metals as part of a closed loop circuit, the thermocouple junctions being respectively in said parts of the assembly,
    a pair of capacitors having dielectric insulation, both capacitors being included in each of the closed loop circuits and both capacitors having their electrodes respectively connected in said two parts of the circuit assembly, whereby the capacitor dielectric insulation provides the thermally non-conductive barrier and whereby connection of the capacitors in both closed loop circuits provides alternative flow paths for capacitor current through different pairs of thermocouple junctions,
    circuit polarization means selectively responsive to the capacitor current flow direction positioned so as to divert at least some of the current through one pair of thermocouple junctions for current flow in one direction and through the other pair of thermocouple junctions for current flow in the opposite direction, and
    circuit interrupter means connected between the circuit assembly and the terminals for varying the load impedance effective in the loop circuits at a rapid rate to set up current oscillations through the capacitors when thermoelectrically powered currents flow around the thermocouple loop circuits that are commensurately related to a temperature differential set up between the two heat transfer elements.

2. A thermoelectric energy converter according to claim 1, wherein the circuit polarization means comprise four diodes, each diode having a current input electrode and a circuit output electrode and each diode being connected in series with a corresponding thermocouple junction to form a diode-junction combination, first and second diode-junction combinations being connected in parallel in each part of the assembly, the two parallel-connected combinations being connected by the two capacitors, the two diodes in each such part having their polarities reversed, thereby providing alternative flow paths according to the flow direction of the capacitor current.

3. A thermoelectric energy converter according to claim 2, wherein first thermocouple junctions of each part of the assembly are closer to the thermal interface surfaces of the nearest heat transfer element than are the second thermocouple junctions in each part of the assembly.

4. A thermoelectric energy converter according to claim 2, in which each parallel-connected combination of diode and junction comprises a thermocouple junction between different metals A and B in one part of the circuit assembly, the metal sequence in relation to diode polarity being such as to permit forward polarity current flow across the junction from metal A to metal B, whereas the metal sequence in each diode junction combination in the other part of the circuit assembly is from metal B to metal A when there is forward current polarity flow through the corresponding diodes.

5. A thermoelectric energy converter according to claim 4, in which the thermocouple junctions in the diode-junction combinations in at least one part of the circuit assembly are each connected to the current output electrode of the corresponding diode, whereby forward polarity current through each diode flows directly through the junction before passing into the capacitor.

6. A thermoelectric energy converter according to claim 4, in which the thermocouple junctions in the diode-junction combinations in at least one part of the circuit assembly are each connected to the current input electrode of the corresponding diode, whereby forward polarity current through each diode flows directly from the junction before passing into the capacitor.

7. A thermoelectric energy converter according to claim 1, in which the circuit polarization means comprise magnetizing means for applying a unidirectional magnetic field, said means being positioned to direct a field to at least one of the thermocouple junctions with its field orientated to act transversely with respect to current flow through that junction.

8. A thermoelectric energy converter according to claim 2, in which each part of the circuit assembly includes a composite thermocouple assembly of three metals, A, B, and C, with interfaces A-B, B-C, A-C, constituting A-B and B-A thermocouple junctions, means for connecting said junctions in a primary closed loop circuit including the two capacitors, said capacitors being respectively connected between the metals A of two thermocouple assemblies and the metals B of two thermocouple assemblies, two secondary closed loop circuits, each including one of the capacitors and a connection between the metals C of the two thermocouple assemblies, an external closure path through the terminals, one secondary circuit including the A-C and C-A junctions and the other secondary circuit including the C-B and B-C junctions, and the junctions of each of the thermocouple assemblies lying in the polarizing magnetic field produced by the magnetization means.

9. A thermoelectric energy converter according to claim 8, in which the junction assemblies and the capacitors are interconnected by conductors which confine the current oscillations to flow paths at right angles to the field direction of the magnetizing means.

10. A thermoelectric energy converter according to claim 7, in which at least one of the thermocouple junction assemblies comprises a composite assembly of three metals A, B and C, with planar junction interfaces A-B, B-C, A-C, the magnetizing means produce a field direction at at least one junction interface lying in the plane of the junction interface but directed at another interface, so as to have a component at right angles to the plane of the junction interface.

11. A thermoelectric energy converter according to claim 7, in which at least one of the metals forming a junction is ferromagnetic.

12. A thermoelectric energy converter according to claim 7, in which at least one thermocouple junction in a pair is subjected to a magnetic field provided by magnetizing means adjacent that junction.

13. A thermoelectric energy converter comprising:
a thermoelectric circuit assembly divided into two thermally-isolated parts separated by a thermally non-conductive barrier and connected to a pair of terminals adapted to be coupled to an external electric power system,
a structure housing the thermoelectric circuit assembly and bounded by heat transfer elements providing two external thermal interface surface and two internal thermal interface surfaces, there being layers of heat-conducting electrically non-conducting insulation separating the heat transfer elements from the thermoelectric circuit assembly,
a first pair of thermocouple junctions included in said assembly, formed by contact between metals having different thermoelectric properties and connected by these metals as part of a closed loop circuit, the thermocouple junctions being in circuit in different thermally, isolated parts of the assembly,
a second pair of thermocouple junctions included in said assembly, formed by contact between metals having different thermoelectric properties and connected by these metals as part of a closed loop circuit, the thermocouple junctions being in circuit in different thermally-isolated parts of the assembly,
a pair of capacitors, both capacitors being included in each of the closed loop circuits and both capacitors having their electrodes connected in different thermally-isolated parts of the circuit assembly, whereby the capacitor dielectric insulation provides the thermally non-conductive barrier and the common capacitor connection in both closed loop circuits provides alternative flow paths for the capacitor current through different pairs of thermocouple junctions,
circuit polarization means selectively responsive to the capacitor current flow direction positioned to divert at least some of the current through one pair of thermocouple junctions for current flow in one direction and through the other pair of thermocouple junctions for current flow in the opposite direction,
and a source of A.C. power connected across said terminals and having a frequency which is the same as the resonant frequency of the circuit assembly and is operative to set up current oscillations through the capacitors when thermoelectrically powered currents flow around the thermocouple loop circuits commensurately related to a temperature differential set up between the two heat transfer elements.

14. A thermoelectric power converter according to claim 1 in which an inductive circuit component is electrically connected to the capacitor circuit to determine a resonant frequency for the oscillatory current flow.

15. A thermoelectric power converter according to claim 13 in which an inductive circuit component is electrically connected to the capacitor circuit to determine a resonant frequency for the oscillatory current flow.

* * * * *